(12) United States Patent
Yasui et al.

(10) Patent No.: US 12,444,640 B2
(45) Date of Patent: Oct. 14, 2025

(54) METHOD FOR MANUFACTURING ELECTRONIC DEVICE

(71) Applicant: MITSUI CHEMICALS ICT MATERIA, INC., Tokyo (JP)

(72) Inventors: Hiroto Yasui, Sodegaura (JP); Hiroyoshi Kurihara, Nagoya (JP); Jin Kinoshita, Nagoya (JP)

(73) Assignee: MITSUI CHEMICALS ICT MATERIA, INC., Tokyo (JP)

( * ) Notice: Subject to any disclaimer, the term of this patent is extended or adjusted under 35 U.S.C. 154(b) by 50 days.

(21) Appl. No.: 18/564,379

(22) PCT Filed: May 27, 2022

(86) PCT No.: PCT/JP2022/021688
§ 371 (c)(1),
(2) Date: Nov. 27, 2023

(87) PCT Pub. No.: WO2022/250132
PCT Pub. Date: Dec. 1, 2022

(65) Prior Publication Data
US 2024/0258151 A1 Aug. 1, 2024

(30) Foreign Application Priority Data
May 28, 2021 (JP) .................................. 2021-090476

(51) Int. Cl.
*H01L 21/683* (2006.01)
*C09J 133/10* (2006.01)
*H01L 21/304* (2006.01)

(52) U.S. Cl.
CPC ........ *H01L 21/6836* (2013.01); *C09J 133/10* (2013.01); *H01L 21/3043* (2013.01);
(Continued)

(58) Field of Classification Search
CPC ............. H01L 21/6836; H01L 21/3043; H01L 2221/68327; H01L 2221/6834; H01L 2221/68386
See application file for complete search history.

(56) References Cited

U.S. PATENT DOCUMENTS

2005/0208296 A1 9/2005 Saiki et al.
2019/0382633 A1 12/2019 Aizawa et al.
2022/0319918 A1 10/2022 Miura et al.

FOREIGN PATENT DOCUMENTS

EP      0981156 A2   2/2000
JP   2005268613 A   9/2005
(Continued)

OTHER PUBLICATIONS

Office Action (Decision to Grant) issued on Oct. 29, 2024, by the Japanese Patent Office in corresponding Japanese Patent Application No. 2023-524244, and an English Translation of the Office Action. (3 pages).
(Continued)

*Primary Examiner* — Daniel McNally
(74) *Attorney, Agent, or Firm* — BUCHANAN, INGERSOLL & ROONEY PC

(57) ABSTRACT

A method for manufacturing an electronic device includes a step (A) of preparing a structure which includes a wafer including a circuit forming surface, and an adhesive film bonded to the circuit forming surface side of the wafer, a step (B) of back-grinding a surface of the wafer on a side opposite to the circuit forming surface side, and a step (C) of irradiating the adhesive film with an ultraviolet ray and then removing the adhesive film from the wafer. The adhesive film includes a base material layer, and an adhesive resin layer configured with an ultraviolet curable adhesive resin material. The ultraviolet curable adhesive resin material has a storage elastic modulus at 5° C. E' (5° C.) after
(Continued)

curing of $2.0\times10^6$ to $2.0\times10^9$ Pa, and a storage elastic modulus at 100° C. E' (100° C.) of $1.0\times10^6$ to $3.0\times10^7$ Pa.

7 Claims, 1 Drawing Sheet

(52) U.S. Cl.
CPC ............... *H01L 2221/68327* (2013.01); *H01L 2221/6834* (2013.01); *H01L 2221/68386* (2013.01)

(56) References Cited

FOREIGN PATENT DOCUMENTS

| | | |
|---|---|---|
| JP | 2008251934 A | 10/2008 |
| JP | 2014075560 A | 4/2014 |
| JP | 2016072546 A | 5/2016 |
| JP | 2018195746 A | 12/2018 |
| JP | 2020161642 A | 10/2020 |
| WO | 2019139055 A1 | 7/2019 |
| WO | WO-2020246207 A1 * 12/2020 ....... H01L 21/76841 |

OTHER PUBLICATIONS

International Search Report (PCT/ISA/210) with English translation, and Written Opinion (PCT/ISA/237) mailed on Aug. 23, 2022, by the Japanese Patent Office as the International Searching Authority for International Application No. PCT/JP2022/021688.

Extended European Search Report dated May 28, 2025, issued by the European Patent Office in corresponding European Application No. 22811400.5-1211 (9 pages).

* cited by examiner

[Fig.1]
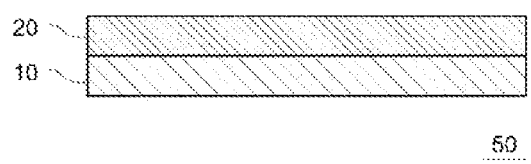
[Fig.2]
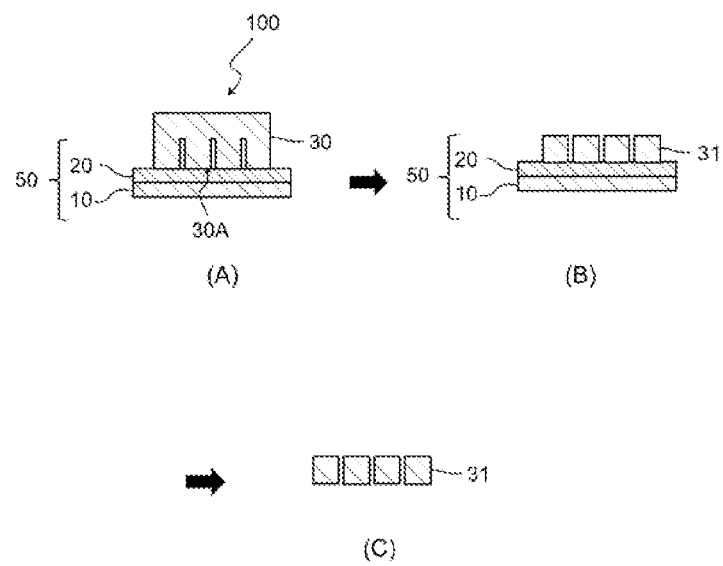
(A)   (B)
(C)

METHOD FOR MANUFACTURING ELECTRONIC DEVICE

TECHNICAL FIELD

The present invention relates to a method for manufacturing an electronic device.

BACKGROUND ART

In a step of grinding a wafer among steps of manufacturing an electronic device, an adhesive film may be bonded to a circuit forming surface of the wafer in order to fix the wafer and prevent damage to the wafer.

For such an adhesive film, a film in which an adhesive resin layer is laminated on a base material film is generally used.

With the progress in a high-density mounting technology, there is a demand for thinning a semiconductor wafer and the like, and a wafer is required to be subjected to thin grinding to a thickness equal to or less than 50 μm, for example.

As one of such thin grinding, there is a pre-dicing method for forming a groove having a predetermined depth on one surface of a wafer before grinding the wafer, and performing the grinding to dice the wafer. In addition, there is a pre-stealth method for forming a modified region by irradiating an inside of a wafer with a laser before grinding, and performing the grinding to dice the wafer.

Examples of technologies relating to an adhesive film suitable for application to the pre-dicing method and the pre-stealth method described above include technologies disclosed in Patent Document 1 (Japanese Unexamined Patent Publication No. 2014-75560) and Patent Document 2 (Japanese Unexamined Patent Publication No. 2016-72546).

Patent Document 1 discloses a surface protective sheet including an adhesive layer on a base material and satisfying the following requirements (a) to (d).
(a) A Young's modulus of the base material is equal to or more than 450 MPa.
(b) A storage elastic modulus of the adhesive layer at 25° C. is equal to or more than 0.10 MPa.
(c) A storage elastic modulus of the adhesive layer at 50° C. is equal to or less than 0.20 MPa.
(d) A thickness of the adhesive layer is equal to or more than 30 μm.

Patent Document 1 discloses that the surface protective sheet can prevent contamination of a protected surface of a work by suppressing entering of water (entering of sludge) to the protected surface of the work from a gap formed when the work is fractured, during a back grinding step of the work.

Patent Document 2 discloses an adhesive tape for a semiconductor wafer surface protection including a base material resin film, and a radiation-curable adhesive layer formed on at least one surface side of the base material resin film, in which the base material resin film includes at least one rigid layer having a tensile modulus of 1 to 10 GPa, and a peeling force at a peeling angle of 30° after radiation-curing the adhesive layer is 0.1 to 3.0 N/25 mm.

Patent Document 2 discloses that, according to the adhesive tape for the semiconductor wafer surface protection, in a back grinding step of a semiconductor wafer applied with a pre-dicing method or a pre-stealth method, a kerf shift of a diced semiconductor chip can be suppressed and the semiconductor wafer can be processed without a damage or contamination.

RELATED DOCUMENT

Patent Document

[Patent Document 1] Japanese Unexamined Patent Publication No. 2014-75560
[Patent Document 2] Japanese Unexamined Patent Publication No. 2016-72546

SUMMARY OF THE INVENTION

Technical Problem

According to studies by the inventors of the present invention, it was clarified that, for example, in a manufacturing process of an electronic device, when an adhesive film is peeled off from a wafer after a back grinding step, an adhesive residue is likely to be generated on a dicing street (scribe line) on the wafer side. In particular, it was clarified that, in the manufacturing process of the electronic device using a pre-dicing method or a pre-stealth method, when the adhesive film is peeled off from the wafer (diced chip) after the back grinding step, the adhesive residue is likely to be generated on the wafer side.

Specifically, in the pre-dicing method, the adhesive film is bonded to one surface of the wafer which has a groove on the one surface, and accordingly, the adhesive residue is likely to be generated in the groove and/or in the vicinity of the groove. In particular, since the groove is usually cut into using a blade, a minute chip is likely to be generated in the groove, which is considered to be a factor of the generation of the adhesive residue.

Even in the pre-stealth method, when the adhesive film is peeled off from the diced wafer (chip), it is considered that the adhesive residue is likely to be generated on a chip end portion.

The present invention has been made in view of the above circumstances. One of the objects of the present invention is to suppress an "adhesive residue" when the adhesive film is peeled off from a wafer (or a diced chip) after a back grinding step in the manufacturing of the electronic device.

Solution to Problem

The inventors of the present invention have investigated improvement from various viewpoints. As a result, the inventors of the present invention have completed the invention provided below and solved the problem described above.

The present invention includes the following aspects.

1.
A method for manufacturing an electronic device, the method at least including,
a step (A) of preparing a structure which includes a wafer including a circuit forming surface, and an adhesive film bonded to the circuit forming surface side of the wafer,
a step (B) of back-grinding a surface of the wafer on a side opposite to the circuit forming surface side, and
a step (C) of removing the adhesive film from the wafer after the adhesive film is irradiated with an ultraviolet ray, in which, the adhesive film includes a base material layer, and an adhesive resin layer which is provided on one surface side of the base material layer and configured with an ultraviolet curable adhesive resin material,
regarding the ultraviolet curable adhesive resin material,
when a storage elastic modulus at 5° C. is defined as E' (5° C.) and a storage elastic modulus at 100° C. is defined as E' (100° C.) in a case where a viscoelastic characteristic is measured by the following procedures (i) and (ii),
E' (5° C.) is $2.0 \times 10^6$ to $2.0 \times 10^9$ Pa, and
In which E' (100° C.) is $1.0 \times 10^6$ to $3.0 \times 10^7$ Pa.
[Procedures]
(i) A film having a film thickness of 0.2 mm is formed using the ultraviolet curable adhesive resin material, the film is irradiated with an ultraviolet ray having a main wavelength of 365 nm at an irradiation intensity of 100 mW/cm$^2$ with an ultraviolet ray amount of 1,080 mJ/cm$^2$ using a high-pressure mercury lamp in an environment at 25° C. for ultraviolet curing, and a cured film is obtained.
(ii) A dynamic viscoelasticity of the cured film is measured at a frequency of 1 Hz and a temperature of −50° C. to 200° C. in a tensile mode.

2.
The method for manufacturing an electronic device according to 1.,
in which, when a peeling strength is defined as F0 in a case where the adhesive resin layer of the adhesive film and a mirror-polished silicon wafer are bonded to each other and left to stand for 1 hour, and a peeling test is performed under conditions of a peeling angle of 180° and a peeling rate of 300 mm/min, and
a peeling strength is defined as F1 in a case where the adhesive resin layer of the adhesive film and the mirror-polished silicon wafer are bonded to each other and irradiated with an ultraviolet ray having a wavelength of 365 nm at 1,080 mJ/cm$^2$, and a peeling test is performed under conditions of a peeling angle of 180° and a peeling rate of 300 mm/min,
F1/F0 is 0.02 to 0.60.

3.
The method for manufacturing an electronic device according to 1. or 2.,
In which the adhesive resin layer includes a (meth)acrylic resin having a polymerizable carbon-carbon double bond at a side chain and/or a terminal, and a photoinitiator.

4.
The method for manufacturing an electronic device according to any one of 1. to 3.,
in which the wafer is half-cut or a modification layer is formed on the wafer.

5.
The method for manufacturing an electronic device according to any one of 1. To 4.,
in which a thickness of the adhesive resin layer is equal to or more than 5 μm and equal to or less than 300 μm.

6.
The method for manufacturing an electronic device according to any one of 1. To 5.,
In which a resin configuring the base material layer includes one kind or two or more kinds selected from polyolefin, polyester, polyamide, polyacrylate, polymethacrylate, polyvinyl chloride, polyvinylidene chloride, polyimide, polyetherimide, an ethylene-vinyl acetate copolymer, polyacrylonitrile, polycarbonate, polystyrene, an ionomer, polysulfone, polyethersulfone, polyether ether ketone, and polyphenylene ether.

7.
The method for manufacturing an electronic device according to any one of 1. To 6.,
in which the step (A) includes
at least one step (A1) selected from a step (A1-1) of half-cutting the wafer and a step (A1-2) of irradiating the wafer with a laser to form a modification layer on the wafer, and
a step (A2) of bonding the back grinding adhesive film to the circuit forming surface side of the wafer after the step (A1).

Advantageous Effects of Invention

By the method for manufacturing an electronic device of the present invention, after the back grinding step, an adhesive residue when peeling off the adhesive film from the wafer (or diced chip) can be suppressed.

BRIEF DESCRIPTION OF THE DRAWINGS

FIG. 1 is a diagram (a cross-sectional view) schematically showing an example of a structure of an adhesive film.
FIG. 2 is a diagram (a cross-sectional view) schematically showing an example of a method for manufacturing an electronic device.

DESCRIPTION OF EMBODIMENTS

Hereinafter, embodiments of the present invention will be described in detail with reference to the drawings.

In all the drawings, the same constitutional components are denoted by the same reference numerals, and description thereof will not be repeated as appropriate.

In order to avoid complication, (i) when a plurality of the same constitutional components are present on the same drawing, there may be a case where the reference numeral is given to only one component without giving the reference numeral to all the components; and (ii) in particular, in FIG. 2 and subsequent drawings, there may be a case where the reference numeral is not given again to the same constitutional components as those in FIG. 1.

All the drawings are merely illustrative. A shape or a dimensional ratio of each member in the drawing does not necessarily correspond to an actual article.

In the present specification, the expression "X to Y" in the description of the numerical range means "equal to or more than X" and "equal to or less than Y" unless otherwise specified. For example, "1 to 5% by mass" means "equal to or more than 1% by mass and equal to or less than 5% by mass".

In a case where substitution or non-substitution is not explicitly indicated in the description of a group (atomic group) in the present specification, the group (atomic group) is intended to include both a group (atomic group) having no substituent and a group (atomic group) having a substituent. For example, "alkyl group" encloses not only an alkyl group not having a substituent (unsubstituted alkyl group) but also an alkyl group having a substituent (substituted alkyl group).

The expression "(meth)acryl" in the present specification represents a concept including both acryl and methacryl. The same applies to similar expressions such as "(meth)acrylate".

Unless otherwise specified, the term "organic group" in the present specification means an atomic group obtained by removing one or more hydrogen atoms from an organic compound. For example, a "monovalent organic group" represents an atomic group obtained by removing one hydrogen atom from an arbitrary organic compound.

The term "electronic device" in the present specification is used as a meaning including an element, a device, a final product, and the like, to which electronic engineering technology has been applied, such as a semiconductor chip, a semiconductor element, a printed circuit board, an electric circuit display device, an information communication terminal, a light emitting diode, a physical battery, and a chemical battery.

FIG. 1 is a cross-sectional view schematically showing an example of a structure of an adhesive film (an adhesive film 50) used in the present embodiment.

The adhesive film 50 is used to protect a surface of a wafer.

As shown in FIG. 1, the adhesive film 50 includes a base material layer 10, and an ultraviolet curable adhesive resin layer 20 provided on one surface side of the base material layer 10 (an adhesive resin layer configured with an ultraviolet curable adhesive resin material).

Here, regarding the ultraviolet curable adhesive resin material configuring the adhesive resin layer 20, when a storage elastic modulus at 5° C. is defined as E' (5° C.) and a storage elastic modulus at 100° C. is defined as E' (100° C.) in a case where a viscoelastic characteristic is measured by the following procedures (i) and (ii), E' (5° C.) is $2.0 \times 10^6$ to $2.0 \times 10^9$ Pa and preferably $2.5 \times 10^7$ to $6.5 \times 10^8$ Pa, and E' (100° C.) is $1.0 \times 10^6$ to $3.0 \times 10^7$ Pa and preferably $3.0 \times 10^6$ to $2.0 \times 10^7$ Pa.

In addition, the storage elastic modulus (E' (5° C.)) of the ultraviolet curable adhesive resin material at 5° C. is equal to or more than $2.0 \times 10^6$ Pa, preferably equal to or more than $5.0 \times 10^6$ Pa, more preferably equal to or more than $1.0 \times 10^7$ Pa, even more preferably equal to or more than $2.0 \times 10^7$ Pa, still preferably equal to or more than $2.5 \times 10^7$ Pa, and equal to or less than $2.0 \times 10^9$ Pa, preferably equal to or less than $1.0 \times 10^9$ Pa, more preferably equal to or less than $8.0 \times 10^8$ Pa, even more preferably equal to or less than $6.5 \times 10^1$ Pa, and still preferably equal to or less than $5.0 \times 10^1$ Pa. The storage elastic modulus (E' (100° C.)) of the ultraviolet curable adhesive resin material at 100° C. is equal to or more than $1.0 \times 10^6$ Pa, preferably equal to or more than $3.0 \times 10^6$ Pa, more preferably equal to or more than $4.0 \times 10^6$ Pa, even more preferably equal to or more than $5.0 \times 10^6$ Pa, and equal to or less than $3.0 \times 10^7$ Pa, preferably equal to or less than $2.5 \times 10^7$ Pa, and more preferably equal to or less than $2.0 \times 10^7$ Pa.

[Procedures]
(i) A film having a film thickness of 0.2 mm is formed using the ultraviolet curable adhesive resin material, the film is irradiated with an ultraviolet ray having a main wavelength of 365 nm at an irradiation intensity of 100 mW/cm² with an ultraviolet ray amount of 1,080 mJ/cm² using a high-pressure mercury lamp in an environment at 25° C. for ultraviolet curing, and a cured film is obtained.
(ii) A dynamic viscoelasticity of the cured film is measured at a frequency of 1 Hz and a temperature of −50° C. to 200° C. in a tensile mode.

In addition, in order to suppress polymerization inhibition by oxygen, a film formed by using the ultraviolet curable adhesive resin material is in a state of being bonded to, for example, a release film during the ultraviolet light irradiation in the procedure (i). Specifically, it is as follows.

An ultraviolet curable adhesive resin material having the same composition as the adhesive resin layer 20 and a thickness of 0.2 mm is prepared.

The ultraviolet curable adhesive resin material is sandwiched between silicone release-treated surfaces of a colorless transparent polyethylene terephthalate film (separator) having both sides subjected to a silicone release treatment.

Examples of the silicone release-treated colorless transparent polyethylene terephthalate film (separator) include SP-PET T15 and T18 manufactured by Mitsui Chemicals Tohcello, Inc., Purex A31 and A41 manufactured by TOYOBO CO., LTD., and the like.

The obtained sample (three-layer configuration of separator/adhesive resin layer 20/separator) is irradiated with an ultraviolet ray having a main wavelength of 365 nm at an irradiation intensity of 100 mW/cm² with an ultraviolet ray amount of 1,080 mJ/cm² using a high-pressure mercury lamp in an environment at 25° C. for ultraviolet curing.

After the ultraviolet curing, the separators on both sides are peeled off to obtain a sample for measurement. A size of the sample for measurement is 10 mm in width and 50 mm in length.

Using a solid viscoelasticity measurement device, the sample for measurement is set in the device to have a distance between chucks of 20 mm, and a viscoelasticity is measured at a frequency of 1 Hz and a temperature in a range of −50° C. to 200° C. in a tensile mode. Examples of the solid viscoelasticity measurement device include RSA3 manufactured by TA Instruments, and the like.

One of the features of the adhesive film 50 is that the ultraviolet curable adhesive resin material configuring the adhesive resin layer 20 satisfies requirements of the storage elastic modulus described above.

A relationship between the requirements of the storage elastic modulus described above and the suppression of the adhesive residue can be described as follows. It is noted, just to be sure, that the present invention is not limited to the following description.

With regard to a viscoelasticity of a polymer, a change in frequency is very similar to a change in temperature, and it is known that increasing the frequency and lowering the temperature have the same effect (time-temperature superposition).

At the time of peeling an adhesive film, a cured film of the adhesive resin layer is instantaneously greatly deformed. Accordingly, it is considered that a viscoelastic behavior in a region with a higher frequency (that is, a region with a lower temperature) corresponds well to an actual peeling aspect. In other words, although the peeling of the adhesive film after curing is usually performed at room temperature, it is considered that a viscoelastic behavior in a region with a high frequency (that is, a region with a low temperature) corresponds well to an actual peeling behavior. In addition, from the past knowledge and the like of the inventors of the present invention, it is considered that a viscoelastic behavior in a region with a low frequency (that is, a region with a high temperature) reflects a crosslinking state of the cured film of the adhesive resin layer.

In other words, although the peeling of the adhesive film after curing is usually performed at room temperature, it is presumed that the storage elastic modulus at a low temperature of about 5° C. and the storage elastic modulus at a high temperature of about 100° C. are closely related to the peeling aspect. More specifically, the beverage is as follows.

With regard to the storage elastic modulus at 5° C.: a change in frequency is very similar to a change in temperature, and it is known that increasing the frequency and lowering the temperature have the same effect (time-temperature superposition). During the tape peeling, it is known that the adhesive material is instantaneously greatly deformed, and it is considered that a viscoelastic behavior in a region with a higher frequency (that is, a region with a lower temperature) is close to an actual peeling mode. Accordingly, although the tape peeling is usually performed at room temperature, it is presumed that the storage elastic modulus at 5° C., which is a lower temperature, represents the behavior of the adhesive material when the tape is actually peeled in an excellent manner. In a case where E' (5° C.) is excessively high, the toughness of the adhesive material is significantly impaired, so that the adhesive residue due to breakage of the adhesive layer is likely to be generated. In addition, in a case where E' (5° C.) is excessively low, an interaction between the adhesive material and the adherend is excessively large such that peeling is difficult to occur, thus, it is presumed that the adhesive residue is likely to be generated.

Regarding the storage elastic modulus at 100° C.: A temperature of 100° C. is a sufficiently higher temperature than a glass transition temperature of an adhesive material, and it is considered that an amorphous adhesive material is completely in an amorphous state. Therefore, it is considered that E' (100° C.) indicates a crosslinking density of the adhesive material. In a case where E' (100° C.) is excessively high, the toughness of the adhesive material is significantly impaired, and the adhesive material is fragile and easy to break, thus, it is presumed that the adhesive residue is likely to be generated. In addition, it is presumed that, for a material having excessively low E' (100° C.), the interaction between the adhesive material and the adherend is high and the peeling is difficult to be performed, and thus the adhesive residue is generated.

It is considered that both E' (5° C.) and E' (100° C.) being within appropriate numerical ranges means that the performance balance of the adhesive is particularly excellent from viewpoints of toughness at the time of peeling and crosslinking density. That is, it is considered that, by manufacturing the electronic device using the adhesive film (particularly the adhesive resin layer) so that both E' (5° C.) and E' (100° C.) are within appropriate numerical values, the adhesive residue is less likely to be generated particularly in the pre-dicing method or the pre-stealth method.

The adhesive film 50 satisfying the requirements of the storage elastic modulus described above can be manufactured by suitably selecting materials, suitably blending each material, and suitably selecting manufacturing conditions or the like. Details thereof will be described below as required.

Hereinafter, in "1. Adhesive Film", each layer and the like configuring the adhesive film 50 will be described in detail.

1. Adhesive Film (Base Material Layer)

The base material layer 10 is a layer provided for the purpose of making the characteristics such as the handling, mechanical properties, heat resistance, and the like of the adhesive film 50 more favorable.

The base material layer 10 is not particularly limited as long as it has a mechanical strength capable of withstanding an external force applied when processing a wafer, and examples thereof include a resin film.

Examples of the resin configuring the base material layer 10 include one kind or two or more kinds selected from polyolefins such as polyethylene, polypropylene, poly(4-methyl-1-pentene), and poly(1-butene); polyesters such as polyethylene terephthalate, polybutylene terephthalate, and polyethylene naphthalate; polyamides such as nylon-6, nylon-66, and polymetaxylene adipamide; a (meth)acrylic resin such as polyacrylates and polymethacrylates; polyvinyl chlorides; polyvinylidene chlorides; polyimides; polyetherimides; ethylene-vinyl acetate copolymers; polyacrylonitrile; polycarbonates; polystyrenes; ionomers; polysulfones; polyethersulfone; polyether ether ketone; polyphenylene ether, and the like.

Among the above, from the viewpoint of improving mechanical properties and transparency, one kind or two or more kinds selected from the group consisting of polypropylene, polyethylene terephthalate, polyethylene naphthalate, polyamide, and polyimide, an ethylene-vinyl acetate copolymer, and polybutylene terephthalate are preferable, and one kind or two or more kinds selected from polyethylene terephthalate and polyethylene naphthalate are more preferable.

The base material layer 10 may be a single layer or a layer of two or more kinds.

In addition, the form of a resin film used to provide the base material layer 10 may be a stretched film, or may be a film which is stretched in a uniaxial or biaxial direction. From the viewpoint of improving the mechanical strength of the base material layer 10, the film stretched in the uniaxial or biaxial direction is preferable.

From the viewpoint of suppressing warping of the wafer after grinding, the base material layer 10 is preferably annealed in advance. The base material layer 10 may be subjected to a surface treatment in order to improve the adhesiveness with other layers. Specifically, a corona treatment, a plasma treatment, an undercoating treatment, a primer coating treatment, or the like may be performed.

From the viewpoint of obtaining excellent film properties, a thickness of the base material layer 10 is preferably equal to or more than 20 μm and equal to or less than 250 μm, more preferably equal to or more than 30 μm and equal to or less than 200 μm, and even more preferably equal to or more than 50 μm and equal to or less than 150 μm.

(Adhesive Resin Layer)

The adhesive film 50 includes the ultraviolet curable adhesive resin layer 20.

The adhesive resin layer 20 is a layer which is provided on one surface side of the base material layer 10 and which contacts and adheres to a circuit forming surface a wafer, when the adhesive film 50 is bonded to the circuit forming surface thereof.

The adhesive resin layer 20 is formed using a suitable ultraviolet curable adhesive resin material. Specifically, the adhesive resin layer 20 is formed using an ultraviolet curable adhesive resin material having adhesiveness decreasing by an ultraviolet ray.

When the adhesive resin layer 20 is irradiated with the ultraviolet ray, curing (crosslinking or the like) occurs and the adhesiveness decreases. Accordingly, the wafer (or a chip obtained by dicing the wafer) is easily peeled off from the adhesive film 50.

The ultraviolet curable adhesive resin material preferably includes a (meth)acrylic resin known in the fields of an adhesive, an adhesive, and the like.

Examples of the (meth)acrylic resin include homopolymers of (meth)acrylic acid ester compounds, copolymers of (meth)acrylic acid ester compounds and comonomers, and the like. Examples of (meth)acrylic acid ester compounds, which are a raw material monomer, include methyl (meth) acrylate, ethyl (meth)acrylate, butyl (meth)acrylate, 2-ethylhexyl (meth)acrylate, hydroxyethyl (meth)acrylate, hydroxypropyl (meth)acrylate, dimethylaminoethyl (meth) acrylate, glycidyl (meth)acrylate, and the like. These (meth) acrylic acid ester compounds may be used alone or in combination of two or more kinds thereof.

In addition, examples of the comonomer configuring the (meth)acrylic copolymer include vinyl acetate, (meth)acrylonitrile, styrene, (meth)acrylate, itaconic acid, (meth) acrylic amide, and methylol (meth)acrylic amide, maleic anhydride, and the like. In a case where these comonomers are used, these comonomers may be used alone or in combination of two or more kinds thereof.

The ultraviolet curable adhesive resin material preferably includes a (meth)acrylic resin having a polymerizable carbon-carbon double bond at a side chain and/or a terminal, and a photoinitiator, and may further include a crosslinking agent, as necessary. The ultraviolet curable adhesive resin material may further include a low-molecular-weight compound (a polyfunctional (meth)acrylate compound or the like) having two or more polymerizable carbon-carbon double bonds in one molecule.

The (meth)acrylic resin having the polymerizable carbon-carbon double bond at the side chain and/or the terminal is specifically obtained as follows. First, a monomer having an ethylenic double bond and a copolymerizable monomer having a functional group (P) are copolymerized. Next, the functional group (P) included in this copolymer and a monomer having a functional group (Q) capable of causing an addition reaction, a condensation reaction, or the like with the functional group (P) are reacted with a double bond remaining in the monomer and a polymerizable carbon-carbon double bond is introduced into the copolymer molecule.

Examples of the monomer having an ethylenic double bond include one kind or two or more kinds from among acrylic acid alkyl esters such as methyl (meth)acrylate, 2-ethylhexyl (meth)acrylate, butyl (meth)acrylate, and ethyl (meth)acrylate, monomers having an ethylenic double bond such as methacrylic acid alkyl ester monomers, vinyl esters such as vinyl acetate, (meth)acrylonitrile, (meth)acrylamide, styrene, and the like.

Examples of the copolymerizable monomer having the functional group (P) include (meth)acrylate, maleic acid, 2-hydroxyethyl (meth)acrylate, glycidyl (meth)acrylate, N-methylol (meth)acrylamide, (meth)acryloyloxyethyl isocyanate, and the like. These may be used alone or in combination of two or more kinds thereof.

Regarding ratio of the monomer having an ethylenic double bond and the copolymerizable monomer having the functional group (P), an amount of the monomer having the ethylenic double bond is preferably 70 to 99% by mass, and an amount of the copolymerizable monomer having a functional group (P) is preferably 1 to 30% by mass. More preferably, the amount of the monomer having the ethylenic double bond is 80 to 95% by mass, and the amount of the copolymerizable monomer having the functional group (P) is 5 to 20% by mass.

Examples of the monomer having the functional group (Q) can include the same monomer as the copolymerizable monomer having the functional group (P).

As a combination of the functional group (P) and the functional group (Q) reacted when introducing a polymerizable carbon-carbon double bond into a copolymer of the monomer having the ethylenic double bond and the copolymerizable monomer having the functional group (P), a combination which easily causes an addition reaction is desirable such as a carboxyl group and an epoxy group, a carboxyl group and an aziridinyl group, and a hydroxyl group and an isocyanate group. In addition, without being limited to an addition reaction, any reaction, such as a condensation reaction between carboxylic acid group and hydroxyl group, can be applied as long as the reaction is capable of easily introducing a polymerizable carbon-carbon double bond.

In a case of copolymerizing the monomer having the ethylenic double bond and the copolymerizable monomer having the functional group (P), a polymerization initiator can be used. Examples of the polymerization initiator include a benzoyl peroxide-based polymerization initiator, and a radical polymerization initiator such as t-butylperoxy-2-ethylhexanoate.

Examples of the low-molecular-weight compound having two or more polymerizable carbon-carbon double bonds in a molecule include a polyfunctional (meth)acrylate compound and the like, such as tripropylene glycol di(meth) acrylate, trimethylolpropane tri(meth)acrylate, tetramethylolmethane tetraacrylate, pentaerythritol tetra(meth)acrylate, dipentaerythritol monohydroxypenta(meth)acrylate, dipentaerythritol penta(meth)acrylate, dipentaerythritol hexa(meth)acrylate, ditrimethylolpropane tetraacrylate, and the like. In a case where these are used, these may be used alone or in combination of two or more kinds thereof. An addition amount of the low-molecular-weight compound having two or more polymerizable carbon-carbon double bonds in a molecule is preferably 0.1 to 20 parts by mass, and more preferably 5 to 18 parts by mass with respect to 100 parts by mass of the (meth)acrylic resin.

In addition, the addition amount of the low-molecular-weight compound having two or more polymerizable carbon-carbon double bonds in a molecule is preferably equal to or more than 0.1 parts by mass, more preferably equal to or more than 1 part by mass, even more preferably equal to or more than 3 parts by mass, and still preferably 5 parts by mass, and preferably equal to or less than 20 parts by mass, more preferably equal to or less than 18 parts by mass, even more preferably equal to or less than 15 parts by mass, and still preferably equal to or less than 13 parts by mass, with respect to 100 parts by mass of the (meth)acrylic resin.

The photoinitiator is usually irradiated with an ultraviolet ray to generate a chemical species (radical or the like) that polymerizes a polymerizable carbon-carbon double bond.

Examples of the photoinitiator include benzoin, isopropylbenzoin ether, isobutylbenzoin ether, benzophenone, Michler's ketone, chlorothioxanthone, dodecylthioxanthone, dimethylthioxanthone, diethylthioxanthone, acetophenone diethylketal, benzyldimethylketal, 1-hydroxycyclohexylphenylketone, 2-hydroxy-2-methyl-1-phenylpropan-1-one, 2-benzyl-2-dimethylamino-4'-morpholinobutyrophenone, 2,2-dimethoxy-2-phenylacetophenone, 2-dimethylamino-2-(4-methylbenzyl)-1-(4-morpholine-4-yl-phenyl)butan-1-one, and the like.

The photoinitiator may be used alone or in combination of two or more kinds thereof.

An addition amount of the photoinitiator is preferably 0.1 to 15 parts by mass, more preferably 1 to 10 parts by mass, and even more preferably 4 to 10 parts by mass with respect to 100 parts by mass of the (meth)acrylic resin.

In addition, the addition amount of the photoinitiator is preferably equal to or more than 0.1 parts by mass, more preferably equal to or more than 1 part by mass, even more preferably equal to or more than 3 parts by mass, still preferably equal to or more than 4 parts by mass, and still more preferably equal to or more than 5 parts by mass, and preferably equal to or less than 15 parts by mass, more preferably equal to or less than 12 parts by mass, even more preferably equal to or less than 10 parts by mass, and still preferably equal to or less than 8 parts by mass with respect to 100 parts by mass of the (meth)acrylic resin.

The ultraviolet curable adhesive resin material may include a crosslinking agent.

Examples of the crosslinking agent include epoxy-based compounds such as sorbitol polyglycidyl ether, polyglycerol polyglycidyl ether, pentaerythritol polyglycidyl ether, and diglycerol polyglycidyl ether; aziridine-based compounds such as tetramethylolmethane-tri-β-aziridinylpropionate, trimethylolpropane-tri-β-aziridinylpropionate, N,N'-diphenylmethane-4,4'-bis(1-aziridinecarboxamide), and N,N'-hexamethylene-1,6-bis(1-aziridinecarboxamide); isocyanate-based compounds such as tetramethylene diisocyanate, hexamethylene diisocyanate, and polyisocyanate, and the like.

The crosslinking agent may be used alone or in combination of two or more kinds thereof.

In a case where the crosslinking agent is used, an amount thereof is usually preferably in a range such that the number of functional groups in the crosslinking agent does not exceed the number of functional groups in the (meth)acrylic resin. However, in a case where a functional group is newly generated in the cross-linking reaction, a case where the cross-linking reaction is slow, or the like, the amount thereof may be greater as necessary.

In a case where the crosslinking agent is used, a content of the crosslinking agent in the ultraviolet curable adhesive resin material is preferably equal to or more than 0.1 parts by mass and equal to or less than 15 parts by mass and preferably equal to or more than 0.5 parts by mass and equal to or less than 5 parts by mass with respect to 100 parts by mass of the (meth)acrylic resin, from a viewpoint of improving balance between heat resistance and adhesiveness of the adhesive resin layer 20.

In addition, in a case where the crosslinking agent is used, the content of the crosslinking agent in the ultraviolet curable adhesive resin material is preferably equal to or more than 0.1 parts by mass, more preferably equal to or more than 0.2 parts by mass, even more preferably equal to or more than 0.5 parts by mass, and still preferably equal to or more than 0.7 parts by mass, and preferably equal to or less than 15 parts by mass, more preferably equal to or less than 10 parts by mass, even more preferably equal to or less than 5 parts by mass, still preferably equal to or less than 3 parts by mass with respect to 100 parts by mass of the (meth)acrylic resin, from a viewpoint of improving the balance between the heat resistance and the adhesiveness of the adhesive resin layer 20.

The adhesive resin layer 20 can be formed, for example, by applying the ultraviolet curable adhesive resin material onto one surface of the base material layer 10. That is, the adhesive resin layer 20 can be provided by applying an ultraviolet curable adhesive resin material prepared by dissolving or dispersing each component described above in a suitable solvent (typically an organic solvent) onto one surface of the base material layer 10.

As a coating method, for example, it is possible to adopt a coating method known in the related art such as a roll coater method, a reverse roll coater method, a gravure roll method, a bar coating method, a comma coater method, or a die coater method. Drying conditions are not particularly limited, but it is generally preferable to carry out drying in a temperature range of 80° C. to 200° C. for 10 seconds to 10 minutes. More preferably, the drying is performed at 80° C. to 170° C. for 15 seconds to 5 minutes. In order to sufficiently accelerate the cross-linking reaction between the crosslinking agent and the (meth)acrylic resin, after completion of the drying of an adhesive coating solution, heating may be performed at 40° C. to 80° C. for approximately 5 to 300 hours.

As shown in examples below, as a method other than the method for applying the ultraviolet curable adhesive resin material onto one surface of the base material layer 10, a method for (i) first applying an ultraviolet curable adhesive resin material to a surface of an easily-peelable base material (separator) to form the adhesive resin layer 20, and (ii) then, bonding the formed adhesive resin layer to one surface of the base material layer 10 can also be used.

A thickness of the adhesive resin layer 20 is preferably equal to or more than 5 μm and equal to or less than 300 μm, more preferably equal to or more than 10 μm and equal to or less than 100 μm, and even more preferably equal to or more than 10 μm and equal to or less than 50 μm or less. When the thickness of the adhesive resin layer 20 is suitably large, sufficient adhesiveness can be obtained. In addition, when the adhesive resin layer 20 is not excessively thick, handling of the adhesive film 50 is improved.

In addition, the thickness of the adhesive resin layer 20 is preferably equal to or more than 5 μm, more preferably equal to or more than 10 μm, and even more preferably equal to or more than 20 μm, and preferably equal to or less than 300 μm, more preferably equal to or less than 100 μm, and even more preferably equal to or less than 50 μm.

(Other Layers)

The adhesive film 50 may include other layers as long as the effect of suppressing the adhesive residue is not impaired. For example, other layers such as an unevenness absorbing resin layer, an adhesive layer, an antistatic layer, and the like may be provided between each of the layers. By providing the unevenness absorbing resin layer, unevenness absorbing property of the adhesive film 50 can be improved. By providing the adhesive layer, the adhesiveness between each of the layers can be improved. In addition, using the antistatic layer, an antistatic property of the adhesive film 50 can be improved.

In addition, from a viewpoint of suppressing deterioration and adhesion of foreign substances before use, an exposed surface of the adhesive resin layer 20 may be protected by an appropriate protective film (easily-peelable film) such as a release film.

(Total Thickness)

From the balance between the mechanical properties and the handling, a thickness of the entire adhesive film 50 is preferably equal to or more than 50 μm and equal to or less than 600 μm, more preferably equal to or more than 50 μm and equal to or less than 400 μm, and even more preferably equal to or more than 50 μm and equal to or less than 300 μm.

(Decrease of Adhesiveness by Exposure to Ultraviolet Ray)

As described above, in the adhesive film 50, the adhesive resin layer 20 is formed using an ultraviolet curable adhesive resin material having adhesiveness decreasing by an ultraviolet ray.

A degree of a decrease of the adhesiveness by an ultraviolet ray is preferably quantified as follows.

When the adhesive resin layer 20 of the adhesive film 50 and a mirror-polished silicon wafer are bonded to each other and left to stand for 1 hour, and a peeling test is performed under conditions of a peeling angle of 180° and a peeling rate of 300 mm/min, a peeling strength is defined as F0.

The adhesive resin layer 20 of the adhesive film 50 and the mirror-polished silicon wafer are bonded to each other and irradiated with an ultraviolet ray having a wavelength of 365 nm at 1,080 mJ/cm$^2$, and a peeling test is performed under conditions of a peeling angle of 180° and a peeling rate of 300 mm/min, a peeling strength is defined as F1.

F1/F0 is preferably 0.01 to 0.60, more preferably 0.01 to 0.20, and even more preferably 0.02 to 0.20.

In addition, F1/F0 is preferably equal to or more than 0.01, more preferably equal to or more than 0.015, and even more preferably equal to or more than 0.02, and preferably equal to or less than 0.60, more preferably equal to or less than 0.30, even more preferably equal to or less than 0.20, still preferably equal to or less than 0.15, and still more preferably equal to or less than 0.12.

When F1/F0 is an appropriate value, position displacement of the wafer during a back grinding step is suppressed, and the adhesive film 50 is easily peeled off after the back grinding step.

Also, the value of F0 itself is, for example, 3 to 20 N/25 mm, specifically 3 to 16 N/25 mm.

In addition, the value of F1 itself is, for example, equal to or less than 10 N/25 mm, specifically equal to or less than 1 N/25 mm, and more specifically equal to or less than 0.5 N/25 mm. F1 may be zero, but F1 is usually equal to or more than 0.005 N/25 mm and specifically equal to or more than 0.01 N/25 mm.

2. Method for Manufacturing Electronic Device

FIG. 2 is a cross-sectional view schematically showing an example of a method for manufacturing an electronic device using the adhesive film 50.

The method for manufacturing an electronic device generally includes at least the following three steps.

(A) a step of preparing a structure 100 including the wafer 30 having a circuit forming surface 30A and the adhesive film 50 bonded to the circuit forming surface 30A side of the wafer 30

(B) a step of back-grinding a surface of the wafer 30 on a side opposite to the circuit forming surface 30A side (C) a step of removing the adhesive film 50 from the wafer 30 after irradiating the adhesive film 50 with an ultraviolet ray In a series of such steps, an adhesive film described in the section of <Adhesive Film> is used as the adhesive film 50. In the method for manufacturing an electronic device according to the present embodiment, when grinding a back surface of the wafer 30, the adhesive film 50 is used as a so-called back grinding tape.

Hereinafter, each step of the method for manufacturing an electronic device will be described.

(Step (A))

First, the structure 100 including the wafer 30 having the circuit forming surface 30A and the adhesive film 50 bonded to the circuit forming surface 30A side of the wafer 30 is prepared.

The structure 100 can be manufactured by, for example, peeling a release film from the adhesive resin layer 20 of the adhesive film 50, exposing a surface of the adhesive resin layer 20, and bonding the circuit forming surface 30A of the wafer 30 onto the adhesive resin layer 20.

Here, the conditions for bonding the circuit forming surface 30A of the wafer 30 to the adhesive film 50 are not particularly limited, but for example, it is possible to set a temperature to 20° C. to 80° C., a pressure to 0.05 to 0.5 MPa, and a bonding speed to 0.5 to 20 mm/sec.

The step (A) preferably further includes at least one step (A1) selected from a step (A1-1) of half-cutting the wafer 30 and a step (A1-2) of irradiating the wafer 30 with a laser to form a modification layer on the wafer 30, and a step (A2) of bonding the back grinding adhesive film 50 to the circuit forming surface 30A side of the wafer 30 after the step (A1).

As described above, the adhesive film 50 can be suitably used in a manufacturing process of the electronic device using the pre-dicing method or the pre-stealth method. Therefore, a manufacturing method of performing the step (A1-1) that is the pre-dicing method or the step (A1-2) that is the pre-stealth method is preferable.

In the step (A2), the adhesive film 50 can be heated and bonded to the circuit forming surface 30A of the wafer 30. Accordingly, it is possible to improve an adhesive state between the adhesive resin layer 20 and the wafer 30 over a long period of time. A heating temperature is not particularly limited, and is, for example, 60° C. to 80° C.

An operation of bonding the adhesive film 50 to the wafer 30 may be manually performed, but in general, the operation can be performed by a device called automatic bonding machine equipped with a roll-shaped adhesive film.

The wafer 30 bonded to the adhesive film 50 is not particularly limited, and the wafer 30 having the circuit forming surface 30A is preferable. Examples thereof include a semiconductor wafer, an epoxy mold wafer, an epoxy mold panel, and the like, and a semiconductor wafer and an epoxy mold wafer are preferable.

In addition, examples of the semiconductor wafer include a silicon wafer, a sapphire wafer, a germanium wafer, a germanium-arsenic wafer, a gallium-phosphorus wafer, a gallium-arsenic-aluminum wafer, a gallium-arsenic wafer, a lithium tantalate wafer, and the like, and use in the silicon wafer is suitably used. As the epoxy mold wafer, a wafer manufactured by an embedded wafer level ball grid array (eWLB) process, which is one of the methods for manufacturing a fan-out type WLP is used.

The semiconductor wafer and the epoxy mold wafer having the circuit forming surface is not particularly limited, and a wafer in which a circuit such as a wiring, a capacitor, a diode, or a transistor is formed on a surface is used. In addition, the circuit forming surface may be plasma-treated.

The circuit forming surface 30A of the wafer 30 may be an uneven surface by having, for example, a bump electrode or the like.

In addition, the bump electrode is, for example, bonded with respect to the electrode formed on a mounting surface when the electronic device is mounted on the mounting surface, so as to form an electrical connection between the electronic device and the mounting surface (mounting surface of a printed substrate or the like).

Examples of the bump electrode include a ball bump, a printing bump, a stud bump, a plating bump, a pillar bump, and the like. That is, the bump electrode is typically a convex electrode. These bump electrodes may be used alone or in combination of two or more kinds thereof.

A height and a diameter of the bump electrode are not particularly limited, and each is preferably 10 to 400 μm and more preferably 50 to 300 μm. A bump pitch at that time is also not particularly limited, and is preferably 20 to 600 μm and more preferably 100 to 500 μm.

A type of metal configuring the bump electrode is not particularly limited, and examples thereof include solder, silver, gold, copper, tin, lead, bismuth, an alloy thereof, and the like, and the adhesive film 50 is suitably used in a case where the bump electrode is a solder bump. These types of metal may be used alone or in combination of two or more kinds thereof.

(Step (B))

Next, the surface (also referred to as a back surface) of the wafer 30 on a side opposite to the circuit forming surface 30A is back-ground.

"Back-grinding" means thinning the wafer 30 to have a predetermined thickness without a damage.

For example, the structure 100 is fixed to a chuck table or the like of a grinder and the back surface (circuit non-forming surface) of the wafer 30 is ground.

In such a back grinding operation, the wafer 30 is ground until the thickness becomes a desired thickness. The thickness of the wafer 30 before the grinding is appropriately determined according to a diameter, type, and the like of the wafer 30, and the thickness of the wafer 30 after the grinding is appropriately determined depending on a size of a chip, a type of a circuit, and the like to be obtained.

In addition, in a case where the wafer 30 is half-cut or the modification layer is formed by laser irradiation, the wafer 30 is diced to obtain a chip 31 by the step (B) as shown in FIG. 2.

The back grinding method is not particularly limited, and a known grinding method can be adopted. The grinding can be performed while performing cooling by pouring water on the wafer 30 and the grindstone. As necessary, a dry polishing step, which is a grinding method using no grinding water, can be performed at the end of the grinding step.

After completion of the back grinding, chemical etching is performed as necessary. The chemical etching is performed by a method of immersing the wafer 30 in a state where the adhesive film 50 is bonded, in an etching solution selected from the group consisting of an acidic aqueous solution formed of hydrofluoric acid, nitric acid, sulfuric acid, or acetic acid alone, or a mixed solution thereof, an alkaline aqueous solution such as a potassium hydroxide aqueous solution or sodium hydroxide aqueous solution. The etching is performed for the purpose of eliminating a distortion generated on the back surface of the wafer 30, further thinning the wafer 30, removing an oxide film or the like, a pretreatment when forming an electrode on the back surface, and the like. The etching solution is appropriately selected according to the purpose described above.

(Step (C))

Next, after irradiating the adhesive film 50 with an ultraviolet ray, the adhesive film 50 is removed from the wafer 30. In the step (C), for example, by irradiating the adhesive film 50 with an ultraviolet ray having a dose of equal to or more than 200 mJ/cm$^2$ and equal to or less than 2,000 mJ/cm$^2$, the adhesive resin layer 20 is cured with the ultraviolet ray to decrease the adhesiveness of the adhesive resin layer 20, and then the adhesive film 50 is removed from the wafer 30.

The ultraviolet light irradiation can be performed, for example, by using a high-pressure mercury lamp with an ultraviolet ray having a main wavelength of 365 nm.

An irradiation intensity of the ultraviolet ray is, for example, equal to or more than 50 mW/cm$^2$ and equal to or less than 500 mW/cm$^2$.

Before removing the adhesive film from the wafer 30, the wafer 30 may be mounted on a dicing tape or a dicing tape with a die attach film together with a ring frame. An operation of removing the adhesive film 50 from the wafer 30 may be manually performed, and in general, the operation can be performed by a device called automatic peeling device.

The surface of the wafer 30 after peeling the adhesive film 50 may be cleaned as necessary. Examples of the cleaning method include wet cleaning such as water cleaning and solvent cleaning, dry cleaning such as plasma cleaning, and the like. In the case of wet cleaning, ultrasonic cleaning may be used in combination. The cleaning method can be appropriately selected depending on a contamination state of the surface of the wafer 30.

(Other Steps)

After performing the steps (A) to (C), a step of mounting the obtained chip 31 on a circuit board or the like may be further performed. These steps can be performed based on known information.

The embodiments of the present invention have been described above, but these are examples of the present invention and various configurations other than the examples can also be adopted. In addition, the present invention is not limited to the embodiments described above, and modifications, improvements, and the like within the range in which the object of the present invention can be achieved are included in the present invention.

EXAMPLES

The embodiments of the present invention will be described in detail based on examples and comparative examples. It is noted, just to be sure, that the present invention is not limited to only examples.

In examples, an index may be represented by "E". For example, 1.3E+06 represents $1.3 \times 10^6$.

<Preparation of Raw Material>

The following raw material was prepared.

(Base Material Layer)

Base material layer 1: A polyethylene terephthalate film (manufactured by TOYOBO CO., LTD., product name: E7180, thickness: 50 μm, one-side corona-treated product)

Base material layer 2: A laminated film formed of low-density polyethylene film/polyethylene terephthalate film/low-density polyethylene film manufactured as follows (total thickness: 110 μm)

A low-density polyethylene film (density: 0.925 kg/m$^3$, thickness: 30 μm) was laminated on both sides of a polyethylene terephthalate film (manufactured by Toray Industries, Inc., product name: LUMIRRO®510, thickness: 50 μm). A corona treatment was performed on one side of the obtained laminated film.

Base material layer 3: A laminated film formed of polyethylene terephthalate film/ethylene-vinyl acetate copolymer film/acrylic film manufactured as follows (total thickness: 145 μm)

A polyethylene terephthalate film (manufactured by TOYOBO CO., LTD., product name: E7180, thickness: 50 μm) and an ethylene-vinyl acetate copolymer (manufactured by DOW-MITSUI POLYCHEMICALS, MFR: 2.5 g/10 min) film (thickness: 70 μm) were laminated by the corona treatment on a bonding surface of the ethylene-vinyl acetate copolymer film with the polyethylene terephthalate film. In addition, a corona discharge treatment was also performed on a surface of the ethylene-vinyl acetate copolymer film on a side opposite to the polyethylene terephthalate film.

Next, an acrylic resin coating solution for a base material layer shown below was coated and dried on a release surface of a polyethylene terephthalate film (separator) subjected to a release treatment to have a dry thickness of 20 μm, and it was bonded to the laminated film formed of polyethylene terephthalate film/ethylene-vinyl acetate copolymer film through the ethylene-vinyl acetate copolymer film and aged (40° C., 3 days). Then, the separator was peeled off.

By doing so, the base material layer 3 was obtained.

(Acrylic Resin Coating Solution for Base Material Layer)

Using 0.5 parts by mass of 4,4'-azobis-4-cyanovaleric acid (manufactured by Otsuka Chemical Co., Ltd., product name: ACVA) as a polymerization initiator, 74 parts by mass of butyl acrylate, 14 parts by mass of methyl methacrylate, 9 parts by mass of 2-hydroxyethyl methacrylate, 2 parts by mass of methacrylic acid, 1 part by mass of acrylamide, and 3 parts by mass of an aqueous solution of polyoxyethylene nonylpropenyl phenyl ether ammonium sulfate (manufactured by DKS Co., Ltd., product name: Aqualon HS-1025) were emulsified and polymerized in deionized water at 70° C. for 9 hours. After the polymerization was completed, a pH was adjusted to 7 with ammonia water, and an acrylic polymer aqueous emulsion having a solid content concentration of 42.5% by mass was obtained. Next, with respect to 100 parts by mass of the acrylic polymer aqueous emulsion, a pH was adjusted to be equal to or more than 9 using ammonia water, and 0.75 parts by mass of an aziridine-based crosslinking agent [manufactured by Nippon Shokubai Co., Ltd., Chemitite PZ-33] and 5 parts by mass of diethylene glycol monobutyl ether were blended.

By doing so, an acrylic resin coating solution for a base material layer was obtained.

((Meth)Acrylic Resin Solution)

(Meth)Acrylic Resin Solution 1:

49 parts by mass of ethyl acrylate, 20 parts by mass of 2-ethylhexyl acrylate, 21 parts by mass of methyl acrylate, 10 parts by mass of glycidyl methacrylate, and 0.5 parts by mass (solid content conversion) of a benzoyl peroxide-based polymerization initiator as a polymerization initiator were reacted in a mixed solvent of 65 parts by mass of toluene and 50 parts by mass of ethyl acetate at 80° C. for 10 hours. After the reaction was completed, the obtained solution was cooled, and 25 parts by mass of xylene, 5 parts by mass of acrylic acid, and 0.5 part by mass of tetradecyl dimethylbenzyl ammonium chloride were added to the cooled solution, and reacted at 85° C. for 32 hours while blowing air.

By doing so, a (meth)acrylic resin solution 1 was obtained.

(Meth)Acrylic Resin Solution 2:

77 parts by mass of n-butyl of acrylate, 16 parts by mass of methyl methacrylate, 16 parts by mass of 2-hydroxyethyl acrylate, and 0.3 parts by mass of t-butylperoxy-2-ethylhexanoate as a polymerization initiator were reacted in a mixed solvent of 20 parts by mass of toluene and 80 parts by mass of ethyl acetate at 85° C. for 10 hours. After the reaction was completed, the obtained solution was cooled, and 30 parts by mass of toluene, 7 parts by mass of methacryloyloxyethyl isocyanate (manufactured by Showa Denko, product name: Karenz MOI), and 0.05 parts by mass of dibutyl tin dilaurate were added thereto and reacted at 85° C. for 12 hours while blowing air.

By doing so, a (meth)acrylic resin solution 2 was obtained.

(Meth)Acrylic Resin Solution 3:

30 parts by mass of ethyl acrylate, 11 parts by mass of methyl acrylate, 26 parts by mass of 2-ethylhexyl acrylate, 7 parts by mass of 2-hydroxyethyl methacrylate, and 0.8 parts by mass (solid content conversion) of a benzoyl peroxide-based polymerization initiator as a polymerization initiator were reacted in a mixed solvent of 7 parts by mass of toluene and 50 parts by mass of ethyl acetate at 80° C. for 9 hours. After the reaction was completed, the obtained solution was cooled, and 25 parts by mass of toluene was added to the cooled solution.

By doing so, a (meth)acrylic resin solution 3 was obtained.

(Photoinitiator)

Omnirad 651 (manufactured by IGM): 2,2-dimethoxy-2-phenylacetophenone

Omnirad 369 (manufactured by IGM): 2-benzyl-2-dimethylamino-4'-morpholinobutyrophenone (Polyfunctional (Meth)Acrylate)

ARONIX M400 (manufactured by Toagosei Co., Ltd.): a mixture of dipentaerythritol pentaacrylate and dipentaerythritol hexaacrylate (Crosslinking Agent)

Isocyanate-based crosslinking agent (manufactured by Mitsui Chemicals, Inc., product name: Olester P49-755)

<Preparation of Ultraviolet Curable Adhesive Resin Material (Coating Solution for Forming Adhesive Resin Layer)>

Materials shown in a column of "Ultraviolet curable adhesive resin material (coating solution for forming adhesive resin layer)" in Table 1 were uniformly mixed to obtain an ultraviolet curable adhesive resin material (coating solution for forming an adhesive resin layer)".

<Measurement of Viscoelasticity of Cured Film of Ultraviolet Curable Adhesive Resin Material>

First, the ultraviolet curable adhesive resin material (coating solution for forming the adhesive resin layer) shown in Table 1 was applied to a silicone release-treated polyethylene terephthalate film (separator) (SP-PET T18 manufactured by Mitsui Chemicals Tohcello, Inc. (thickness of 31 μm)). Next, drying was performed at 120° C. for 3 minutes to form an adhesive resin layer having a thickness of 30 to 40 μm. By overlapping several layers of the obtained adhesive resin layer, a laminate sample having a configuration of separator/adhesive resin layer having a thickness of 0.2 mm/separator was obtained. The obtained laminate sample was heated and aged in an oven at 40° C. for 3 days.

The obtained laminate sample (configuration of separator/adhesive resin layer/separator) was irradiated with an ultraviolet ray having a main wavelength of 365 nm at an irradiation intensity of 100 mW/cm$^2$ with an ultraviolet ray amount of 1,080 mJ/cm$^2$ using a high-pressure mercury lamp in an environment at 25° C. for ultraviolet curing.

Next, the viscoelasticity was measured using a solid viscoelasticity measurement device (manufactured by TA Instruments, RSA3). Specifically, the cured laminate sample was cut to have a width of 10 mm and a length of 50 mm, and the separators on both sides of the cured laminate sample were removed to obtain a measurement sample. After that, the measurement sample was set in the device to have a distance between chucks of 20 mm. A dynamic viscoelasticity was measured at a frequency of 1 Hz and a temperature of −50° C. to 200° C. in a tensile mode.

The storage elastic modulus at 5° C. was defined as E' (5° C.) and the storage elastic modulus at 100° C. was defined as E' (100° C.).

<Manufacture of Adhesive Film>

First, the ultraviolet curable adhesive resin material (coating solution for forming the adhesive resin layer) shown in Table 1 was applied to a silicone release-treated polyethylene terephthalate film (separator). Drying was performed at 120° C. for 3 minutes to form an adhesive resin layer having a thickness of 20 μm.

The formed adhesive resin layer was bonded to the base material layer to form a laminate. Specifically, in a case where the base material layer 1 or 2 was used as the base material layer, the base material layer was bonded to a corona-treated surface. In a case where the base material layer 3 was used as the base material layer, the separator was peeled off and it was bonded to an acrylic film layer side.

The obtained laminate was heated and aged in an oven at 40° C. for 3 days.

From the above, a back grinding adhesive film was obtained.

<Confirmation of Basic Physical Properties>

(1) Evaluation of Adhesiveness: Measurement of Adhesiveness Before and After Ultraviolet Light Irradiation (i) Preparation of Adherend Wafer for Measurement of Adhesiveness:

A mirror surface of a silicon mirror wafer (manufactured by SUMCO Corporation, a 4-inch one-side mirror wafer) was subjected to ozone cleaning (ozone treatment time: 60 seconds) with a UV ozone cleaning device (manufactured by Tech-VISION CO., LTD., UV-208). After that, the mirror surface of the wafer was wiped off with ethanol to obtain an adherend wafer.

(ii) Measurement of Adhesiveness Before Ultraviolet Light Irradiation:

In an environment of 23° C. and 50% RH, the adhesive film obtained in <Manufacture of Adhesive Film> was cut into a width of 50 mm, the separator was peeled off, and the adhesive film was bonded to a mirror surface of the adherend wafer through the adhesive resin layer using a hand roller. Then, it was left to stand for 1 hour.

After leaving it to stand, one end of the adhesive film was sandwiched using a tensile tester (Shimadzu Corporation, product name: autograph AGS-X), and the adhesive film was peeled off from a surface of the adherend wafer at a peeling angle of 180° and peeling rate of 300 mm/min. A stress at this time was measured and converted to N/25 mm to determine the adhesiveness. The evaluation was performed with N=2, and the obtained two values were averaged to obtain a peeling strength F0.

(iii) Measurement of Adhesiveness After Ultraviolet Light Irradiation:

In an environment of 23° C. and 50% RH, the adhesive film for the evaluation of the adhesiveness was cut into a width of 50 mm, the separator was peeled off, and the adhesive film was bonded to a mirror surface of the adherend wafer through the adhesive resin layer using a hand roller. Then, it was left to stand for 1 hour.

After leaving it to stand, the adhesive film was irradiated with an ultraviolet ray having a main wavelength of 365 nm at an irradiation intensity of 100 mW/cm$^2$ with an ultraviolet ray amount of 1,080 mJ/cm$^2$ using a high-pressure mercury lamp in an environment at 25° C. After that, one end of the adhesive film was sandwiched using a tensile tester (Shimadzu Corporation, product name: autograph AGS-X), and the adhesive film was peeled off from a surface of the adherend wafer at a peeling angle of 180° and peeling rate of 300 mm/min. A stress at this time was measured and converted to N/25 mm to determine the adhesiveness. The evaluation was performed with N=2, and the obtained two values were averaged to obtain a peeling strength F1.

F1/F0 was calculated from the obtained numerical values of F1 and F0.

(2) Evaluation of Adhesive Residue

In the above (iii), the adherend wafer after ultraviolet ray peeling was visually observed, and the presence or absence of the adhesive residue was determined. A case where no adhesive residue could be confirmed was described as "No" in Table 1.

<Various Evaluations of Pre-Dicing Method>

(1) Manufacture of Evaluation Wafer

Evaluation Wafer 1:

Using a dicing saw, a mirror surface of a mirror wafer (manufactured by K.S.T. world, 8-inch mirror wafer, a diameter: 200±0.5 mm, thickness: 725±50 μm, one-sided mirror) was half-cut, and an evaluation wafer 1 was obtained. (blade: ZH05-SD3500-N1-70-DD, a chip size: 5 mm×8 mm, a cut depth: 58 μm, a blade rotation speed: 30,000 rpm). When the evaluation wafer 1 was observed with an optical microscope, a kerf width was 35 μm.

Evaluation Wafer 2:

Using a dicing saw, a first stage half-cutting was performed on a mirror surface of a mirror wafer (manufactured by K.S.T. world, 8-inch mirror wafer, a diameter: 200±0.5 mm, thickness: 725±50 μm, one-sided mirror) (blade: Z09-SD2000-Y1·58×0.25 A×40×45E-L, a chip size: 5 mm×8 mm, a cut depth: 15 μm, a blade rotation speed: 30,000 rpm). When it was observed with an optical microscope, a kerf width was 60 μm. Subsequently, a second stage half-cutting was performed (blade: ZH05-SD3500-N1-70-DD, a chip size: 5 mm×8 mm, a cut depth: 58 μm, a blade rotation speed: 30,000 rpm), and an evaluation wafer 2 was obtained.

(2) Performing and Various Evaluations of Pre-Dicing Method

Using a tape laminator (manufactured by Nitto Denko Corporation, DR3000II), the adhesive film was bonded to a half-cut surface of the evaluation wafer (the evaluation wafer 1 or 2) (23° C., a bonding speed 5 mm/sec, a bonding pressure: 0.36 MPa).

Then, using a grinder (manufactured by DISCO CORPORATION, DGP8760), the wafer was back-ground (roughness and precision scraping, precision scraping amount: 40 μm, no polishing, thickness after grinding: 38 μm), and diced.

Then, UV irradiation and adhesive film peeling were performed and device peelability and an adhesive residue after the pre-dicing method were evaluated.

Specifically, regarding the UV irradiation, the adhesive film was irradiated with an ultraviolet ray having a main wavelength of 365 nm at an irradiation intensity of 100 mW/cm$^2$ with an ultraviolet ray amount of 1,080 mJ/cm$^2$ using a high-pressure mercury lamp in an environment at 25° C.

The peeling of the adhesive films was performed in the following procedure. First, using a wafer mounter (manufactured by Nitto Denko Corporation, MSA300), a separately prepared dicing tape (used as a tape for mounting) was bonded to a ring frame for 8-inch wafer and a wafer side of the diced wafer through a pressures sensitive adhesive surface of the dicing tape. Subsequently, using a tape peeling machine (manufactured by Nitto Denko Corporation, HR3000III), the adhesive film for pre-dicing evaluation was peeled off from a wafer notch portion by a peeling tape (manufactured by Lusting System Co., Ltd., PET38REL).

Then, the device peelability was evaluated. In Table 1, a case where the adhesive film for the pre-dicing evaluation could be peeled off from the wafer at one time was described as "OK".

In addition, the adhesive residue on the diced wafer after performing the pre-dicing method was observed and evaluated using an optical microscope (manufactured by Olympus Corporation). In the observation, in particular, it was observed whether there was a thread-like adhesive residue in a portion where a groove was provided in advance. In Table 1, a case where no adhesive residue was confirmed was described as "OK", and a case where the adhesive residue was confirmed was described as "Yes".

Various pieces of information are collectively shown in Table 1.

TABLE 1

| | | | Example 1 | Example 2 | Example 3 | Comparative Example 1 | Comparative Example 2 |
|---|---|---|---|---|---|---|---|
| Adhesive film | Base material | | Base material layer 1 | Base material layer 1 | Base material layer 1 | Base material layer 1 | Base material layer 1 |
| | Ultraviolet curable adhesive resin material (coating solution for forming adhesive resin layer) | Resin solution (100 phr) | (Meth)acrylic resin solution 1 | (Meth)acrylic resin solution 2 | (Meth)acrylic resin solution 1 | (Meth)acrylic resin solution 3 | (Meth)acrylic resin solution 3 |
| | | Photoinitiator | Omnirad 651: 6.9 phr | Omnirad 369: 6 phr | Omnirad 651: 6.9 phr | Omnirad 651: 6.9 phr | Omnirad 651: 6.9 phr |
| | | Acryl oligomer ARONIX M400 | — | — | 11.6 phr | 10 phr | 50 phr |
| | | Crosslinking agent Olester P49-75S | 0.93 phr | 0.93 phr | 0.93 phr | 0.93 phr | 0.93 phr |
| Viscoelasticity of cured product of ultraviolet curable adhesive resin material | E' (unit: Pa) | E (5° C.) | 2.9E+07 | 2.6E+07 | 3.6E+08 | 1.5E+07 | 5.3E+08 |
| | | E (100° C.) | 5.1E+06 | 7.2E+06 | 8.6E+06 | 9.4E+05 | 3.6E+07 |
| Basic physical properties | | Adhesiveness F0 before ultraviolet light irradiation (N/25 mm) | 6.9 | 10.9 | 6.74 | 14.06 | 5.41 |
| | | Adhesiveness F1 after ultraviolet light irradiation (N/25 mm) | 0.7 | 0.2 | 0.09 | 8.69 | 0.07 |
| | | F1/F0 | 0.101 | 0.018 | 0.013 | 0.618 | 0.013 |
| | | Adhesive residue | None | None | None | None | None |
| Various evaluation of pre-dicing method | Evaluation wafer | | Evaluation wafer 1 | Evaluation wafer 1 | Evaluation wafer 1 | Evaluation wafer 1 | Evaluation wafer 1 |
| | Peeling evaluation | Device peelability | OK | OK | OK | OK | OK |
| | | Adhesive residue | OK | OK | OK | Yes | Yes |

| | | | Example 4 | Example 5 | Example 6 | Example 7 | Example 8 |
|---|---|---|---|---|---|---|---|
| Adhesive film | Base material | | Base material layer 2 | Base material layer 1 | Base material layer 3 | Base material layer 3 | Base material layer 3 |
| | Ultraviolet curable adhesive resin material (coating solution for forming adhesive resin layer) | Resin solution (100 phr) | (Meth)acrylic resin solution 2 | (Meth)acrylic resin solution 2 | (Meth)acrylic resin solution 2 | (Meth)acrylic resin solution 1 | (Meth)acrylic resin solution 1 |
| | | Photoinitiator | Omnirad 369: 6 phr | Omnirad 369: 6 phr | Omnirad 369: 6 phr | Omnirad 651: 6.9 phr | Omnirad 651: 6.9 phr |
| | | Acryl oligomer ARONIX M400 | 11.6 phr | 11.6 phr | 11.6 phr | 11.6 phr | 11.6 phr |
| | | Crosslinking agent Olester P49-75S | 0.93 phr | 0.93 phr | 1.86 phr | 0.93 phr | 1.86 phr |
| Viscoelasticity of cured product of ultraviolet curable adhesive resin material | E' (unit: Pa) | E (5° C.) | 2.6E+08 | 2.6E+08 | 3.6E+08 | 3.6E+08 | 6.4E+08 |
| | | E (100° C.) | 1.4E+07 | 1.4E+07 | 1.8E+07 | 8.6E+06 | 1.8E+07 |
| Basic physical properties | | Adhesiveness F0 before ultraviolet light irradiation (N/25 mm) | 7.13 | 10.99 | 7.9 | 11.6 | 10 |
| | | Adhesiveness F1 after ultraviolet light irradiation (N/25 mm) | 0.24 | 0.18 | 0.29 | 0.63 | 0.38 |
| | | F1/F0 | 0.034 | 0.016 | 0.037 | 0.054 | 0.038 |
| | | Adhesive residue | None | None | None | None | None |

TABLE 1-continued

| Various evaluation of pre-dicing method | Evaluation wafer | | Evaluation Wafer 1 | Evaluation wafer 1 | Evaluation wafer 2 | Evaluation wafer 2 | Evaluation Wafer 2 |
|---|---|---|---|---|---|---|---|
| | Peeling evaluation | Device peelability | OK | OK | OK | OK | OK |
| | | Adhesive residue | OK | OK | OK | OK | OK |

As shown in Table 1, when manufacturing the electronic device by the pre-dicing method, in the evaluation using the adhesive film including the adhesive resin layer configured with the ultraviolet curable adhesive resin material in which the storage elastic modulus E' (5° C.) at 5° C. when a cured film was obtained was $2.0 \times 10^6$ to $2.0 \times 10^9$ Pa and the storage elastic modulus E' (100° C.) at 100° C. was $1.0 \times 10^6$ to $3.0 \times 10^7$ Pa, the generation of the adhesive residue after performing the pre-dicing method was suppressed.

On the other hand, in the evaluation using the adhesive film including the adhesive resin layer configured with the ultraviolet curable adhesive resin material in which E' (100° C.) is beyond the range of $1.0 \times 10^6$ to $3.0 \times 10^7$ Pa, the adhesive residue after performing the pre-dicing method was generated (Comparative Examples 1 and 2).

This application claims priority based on Japanese Patent Application No. 2021-090476 filed on May 28, 2021, the disclosures of which are incorporated herein by reference in their entireties.

REFERENCE SIGNS LIST

10 Base material layer
20 Adhesive resin layer
30 Wafer
30A Circuit forming surface
31 Chip
50 Adhesive film
100 Structure

The invention claimed is:

1. A method for manufacturing an electronic device, the method at least comprising:
    a step (A) of preparing a structure which includes a wafer including a circuit forming surface, and an adhesive film bonded to the circuit forming surface side of the wafer;
    a step (B) of back-grinding a surface of the wafer on a side opposite to the circuit forming surface side; and
    a step (C) of removing the adhesive film from the wafer after the adhesive film is irradiated with an ultraviolet ray,
    wherein the adhesive film includes a base material layer, and an adhesive resin layer configured with an ultraviolet curable adhesive resin material, provided on one surface side of the base material layer, and
    regarding the ultraviolet curable adhesive resin material, when a storage elastic modulus at 5° C. is defined as E' (5° C.) and a storage elastic modulus at 100° C. is defined as E' (100° C.) in a case where a viscoelastic characteristic is measured by the following procedures (i) and (ii), E' (5° C.) is $2.0 \times 10^6$ to $2.0 \times 10^9$ Pa, and E' (100° C.) is $1.0 \times 10^6$ to $3.0 \times 10^7$ Pa,
    [Procedure]
    (i) a film having a film thickness of 0.2 mm is formed using the ultraviolet curable adhesive resin material, the film is irradiated with an ultraviolet ray having a main wavelength of 365 nm at an irradiation intensity of 100 mW/cm$^2$ with an ultraviolet ray amount of 1,080 mJ/cm$^2$ using a high-pressure mercury lamp in an environment at 25° C. for ultraviolet curing, and a cured film is obtained,
    (ii) a dynamic viscoelasticity of the cured film is measured at a frequency of 1 Hz and a temperature of −50° C. to 200° C. in a tensile mode.

2. The method for manufacturing an electronic device according to claim 1,
    wherein, when a peeling strength is defined as F0 in a case where the adhesive resin layer of the adhesive film and a mirror-polished silicon wafer are bonded to each other and left to stand for 1 hour, and a peeling test is performed under conditions of a peeling angle of 180° and a peeling rate of 300 mm/min, and
    a peeling strength is defined as F1 in a case where the adhesive resin layer of the adhesive film and the mirror-polished silicon wafer are bonded to each other and irradiated with an ultraviolet ray having a wavelength of 365 nm at 1,080 mJ/cm$^2$, and a peeling test is performed under conditions of a peeling angle of 180° and a peeling rate of 300 mm/min,
    F1/F0 is 0.02 to 0.60.

3. The method for manufacturing an electronic device according to claim 1,
    wherein the adhesive resin layer includes a (meth)acrylic resin having a polymerizable carbon-carbon double bond in a side chain and/or a terminal, and a photoinitiator.

4. The method for manufacturing an electronic device according to claim 1,
    wherein the wafer is half-cut or a modification layer is formed on the wafer.

5. The method for manufacturing an electronic device according to claim 1,
    wherein a thickness of the adhesive resin layer is equal to or more than 5 μm and equal to or less than 300 μm.

6. The method for manufacturing an electronic device according to any claim 1,
    wherein a resin configuring the base material layer includes one kind or two or more kinds selected from polyolefin, polyester, polyamide, polyacrylate, polymethacrylate, polyvinyl chloride, polyvinylidene chloride, polyimide, polyetherimide, an ethylene-vinyl acetate copolymer, polyacrylonitrile, polycarbonate, polystyrene, an ionomer, polysulfone, polyethersulfone, polyether ether ketone, and polyphenylene ether.

7. The method for manufacturing an electronic device according to any claim 1,
    wherein the step (A) includes,
    at least one step (A1) selected from a step (A1-1) of half-cutting the wafer and a step (A1-2) of irradiating the wafer with a laser to form a modification layer on the wafer, and
    a step (A2) of bonding the back grinding adhesive film to the circuit forming surface side of the wafer after the step (A1).

* * * * *